(12) United States Patent
Shivnaraine et al.

(10) Patent No.: US 11,539,374 B2
(45) Date of Patent: Dec. 27, 2022

(54) MATCHED DIGITAL-TO-ANALOG CONVERTERS

(71) Applicant: Rambus Inc., San Jose, CA (US)

(72) Inventors: Ravi Shivnaraine, Toronto (CA); Marcus Van Ierssel, Toronto (CA)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/461,008

(22) Filed: Aug. 30, 2021

(65) Prior Publication Data

US 2022/0077872 A1 Mar. 10, 2022

Related U.S. Application Data

(60) Provisional application No. 63/115,194, filed on Nov. 18, 2020, provisional application No. 63/074,883, filed on Sep. 4, 2020.

(51) Int. Cl.
*H03M 1/66* (2006.01)
*H03M 1/68* (2006.01)

(52) U.S. Cl.
CPC .................... *H03M 1/68* (2013.01)

(58) Field of Classification Search
CPC ........................................... H03M 1/68
USPC ......................... 341/144, 122, 143
See application file for complete search history.

(56) References Cited

U.S. PATENT DOCUMENTS

| | | | | |
|---|---|---|---|---|
| 6,297,759 B1* | 10/2001 | Lewyn | .................. | H03M 1/662 341/150 |
| 7,298,309 B1* | 11/2007 | Wu | ........................ | H03M 1/68 341/152 |
| 2007/0046600 A1* | 3/2007 | Sun | ....................... | G09G 3/3696 345/89 |
| 2009/0295357 A1* | 12/2009 | Lin | ..................... | H02M 3/1584 323/285 |
| 2017/0244321 A1* | 8/2017 | Phillips | .................. | H02M 3/158 |

* cited by examiner

*Primary Examiner* — Peguy Jean Pierre
(74) *Attorney, Agent, or Firm* — The Neudeck Law Firm, LLC

(57) ABSTRACT

A voltage ladder is used to generate reference voltages. The voltage ladder is used by multiple digital-to-analog converters (DACs). In particular, the voltage ladder is used by multiple pulse-width modulation (PWM) DACs. Having multiple DACs utilize a common voltage ladder for their reference voltages reduces mismatched output voltages between DACs. Having multiple DACs utilize the common voltage ladder helps ensure that the reference voltages used by different DACs are not affected by process, voltage, and/or temperature variations in the reference voltages that would occur when using different voltage ladders for each DAC.

20 Claims, 7 Drawing Sheets

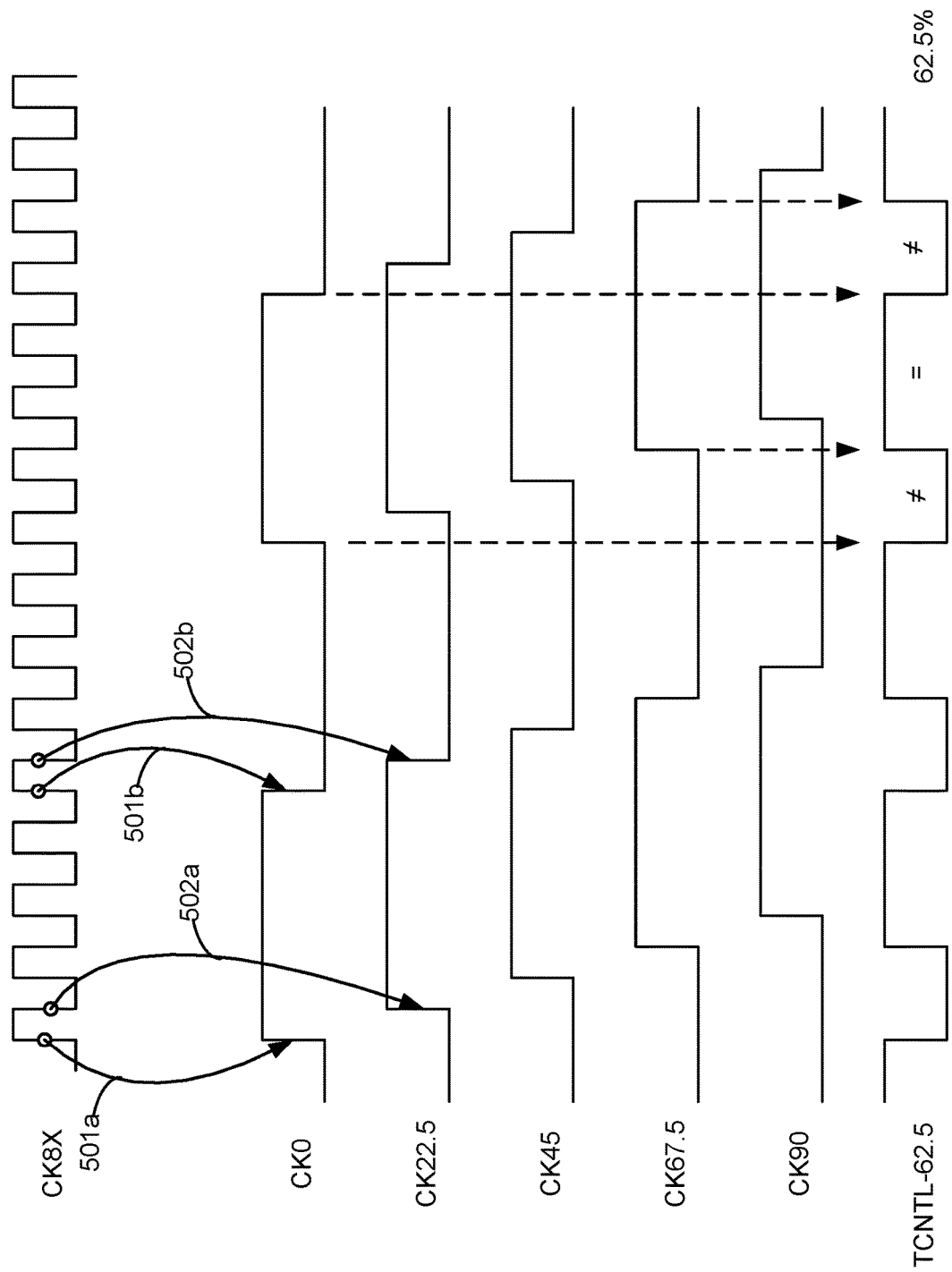

SELECT A FIRST REFERENCE VOLTAGE AND A SECOND REFERENCE VOLTAGE FROM A PLURALITY OF REFERENCE VOLTAGES GENERATED BY A RESISTIVE LADDER THAT IS SHARED BY A PLURALITY OF PULSE-WIDTH MODULATION DIGITAL TO ANALOG CONVERTERS
602

RECEIVE A CLOCK SIGNAL CYCLING AT A CLOCK SIGNAL CYCLE TIME
604

SELECT THE FIRST REFERENCE VOLTAGE TO BE PROVIDED TO A PULSE-WIDTH MODULATION OUTPUT NODE FOR A FIRST PORTION OF CLOCK SIGNAL CYCLE TIME
606

SELECT THE SECOND REFERENCE VOLTAGE TO BE PROVIDED TO THE PULSE-WIDTH MODULATION OUTPUT NODE FOR A SECOND PORTION OF A CLOCK SIGNAL CYCLE TIME.
608

*FIG. 6*

MATCHED DIGITAL-TO-ANALOG CONVERTERS

BRIEF DESCRIPTION OF THE DRAWINGS

FIG. 5 is an illustration of input clock waveforms for generating pulse-width modulation waveforms.

FIG. 6 is a flowchart illustrating a method of generating matched digital-to-analog output voltages.

DETAILED DESCRIPTION OF THE EMBODIMENTS

In an embodiment, a voltage ladder is used to generate reference voltages. The voltage ladder is used by multiple digital-to-analog converters (DACs). In particular, the voltage ladder is used by multiple pulse-width modulation (PWM) DACs. Having multiple DACs utilize a common voltage ladder for their reference voltages reduces mismatched output voltages between DACs. Having multiple DACs utilize the common voltage ladder helps ensure that the reference voltages used by different DACs are not affected by process, voltage, and/or temperature variations in the reference voltages that would occur when using different voltage ladders for each DAC.

Figure 1:
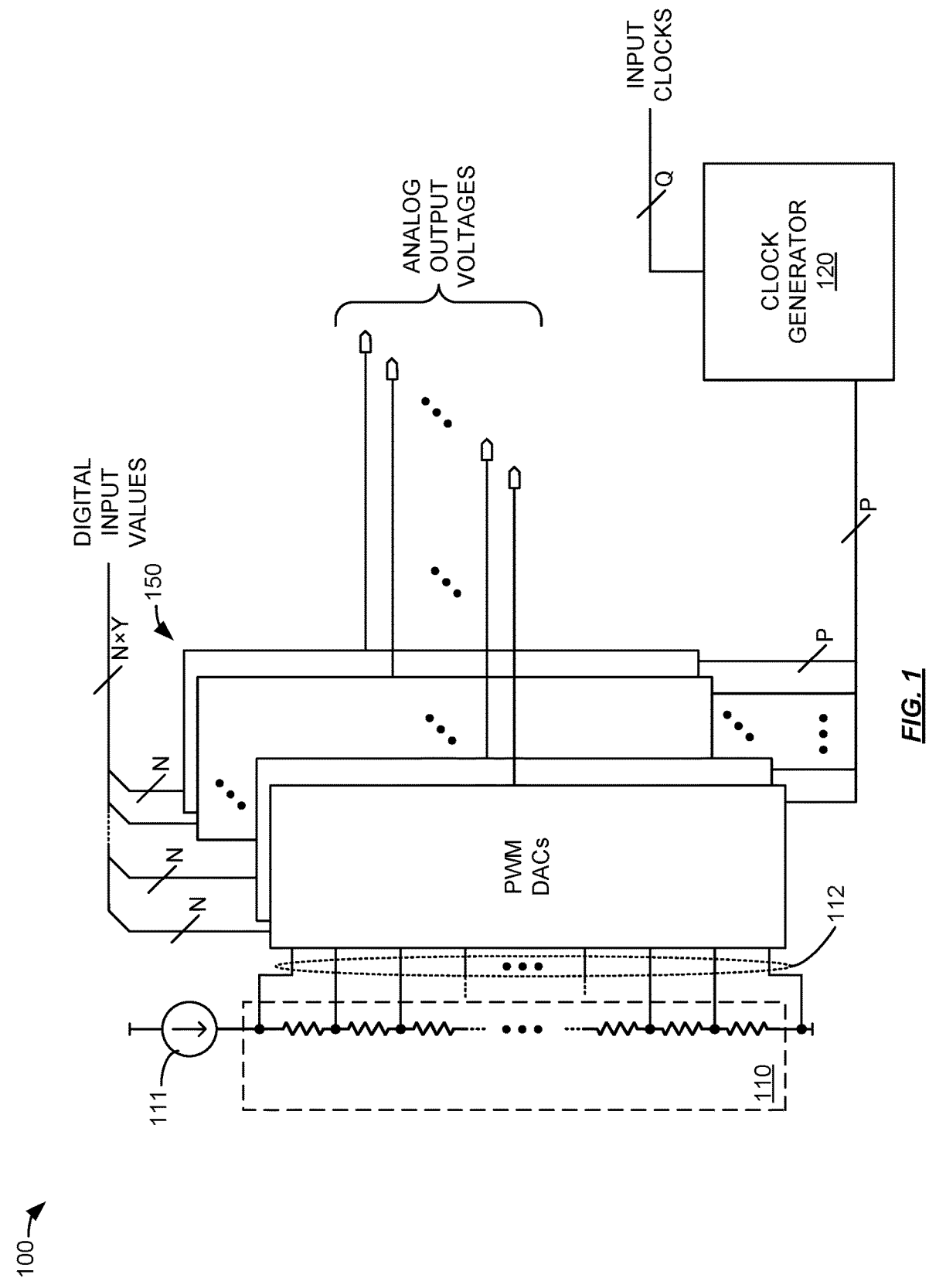
FIG. 1 is a block diagram illustrating matched digital-to-analog converters.

FIG. 1 is a block diagram illustrating matched digital-to-analog converters. In an embodiment, the elements of system 100 reside on an integrated circuit. In FIG. 1, system 100 includes a resistive voltage ladder 110, reference current source 111, reference voltages 112, clock generator 120, and a plurality of PWM DACs 150. PWM DACs 150 each convert N-bit numbers to an analog output voltages. In FIG. 1, Y number of PWM DACs are illustrated generating Y number of analog output voltages.

Reference current source 111 is operatively coupled to voltage ladder 110. Reference current source 111 is operatively coupled to voltage ladder 110 to cause a reference current to flow through the series connected resistors of voltage ladder 110. In an embodiment, reference current source 111 is a bandgap based current reference.

The reference current flowing through the series connected resistors of voltage ladder 110 generates reference voltages 112. Reference voltages 112 are provided to a plurality of PWM DACs 150. For example, a voltage ladder 110 of thirty-one (32) resistors generate thirty (31) reference voltages at the nodes of the voltage ladder between resistors. When combined with the negative and positive supply voltages, thirty-three (33) reference voltages 112 (e.g., $V_{ref}$ [32:0]) may be provided. In system 100, a single voltage ladder 110 provides reference voltages 112 to each of the Y number of PWM DACs 150, where Y is an integer greater than one.

Each PWM DAC 150 also receives P number of clock signals from clock generator 120. Clock generator 120 generates the P number of clock signals from Q number of input clocks. In an embodiment, Q=1 and P=5. In an embodiment, based on a first subset of the values of the N-bits received by each PWM DAC 150, PWM DACs each select two respective reference voltages received from voltage ladder 110. These two respective reference voltages are selected to be from the ends of a single resistor in voltage ladder 110. In other words, the two selected reference voltages are "adjacent" voltage levels being provided by voltage ladder 110.

Based on a second subset of the values of the N-bits received by each PWM DAC 150, PWM DACs 150 each select a respective one or more of the P number of clock signals. The one or more clock signals control the alternating and substantially non-overlapping gating of the selected reference voltages onto a node that determines the output voltage of the respective PWM DAC 150. Thus, the first subset of the values of the N-bits received by a PWM DAC 150 determines a "coarse" selection of the output voltage by determining the two reference voltages from voltage ladder 110 that are to be pulse-width modulated. The second subset of the value of the N-bits received by a PWM DAC 150 determines the pulse widths (or duty cycle) for each the two reference voltages. The pulse width (or duty cycle) determines the contribution each of the two reference voltages will have on the output analog voltage. Thus, in an embodiment, the first subset and the second subset are disjoint subsets of the N-bits received by each PWM DAC 150. For example, the second subset may consist of the M least significant bits and the first subset may consist of the N-M most significant bits of the N-bits received by each PWM DAC 150.

Figure 2:
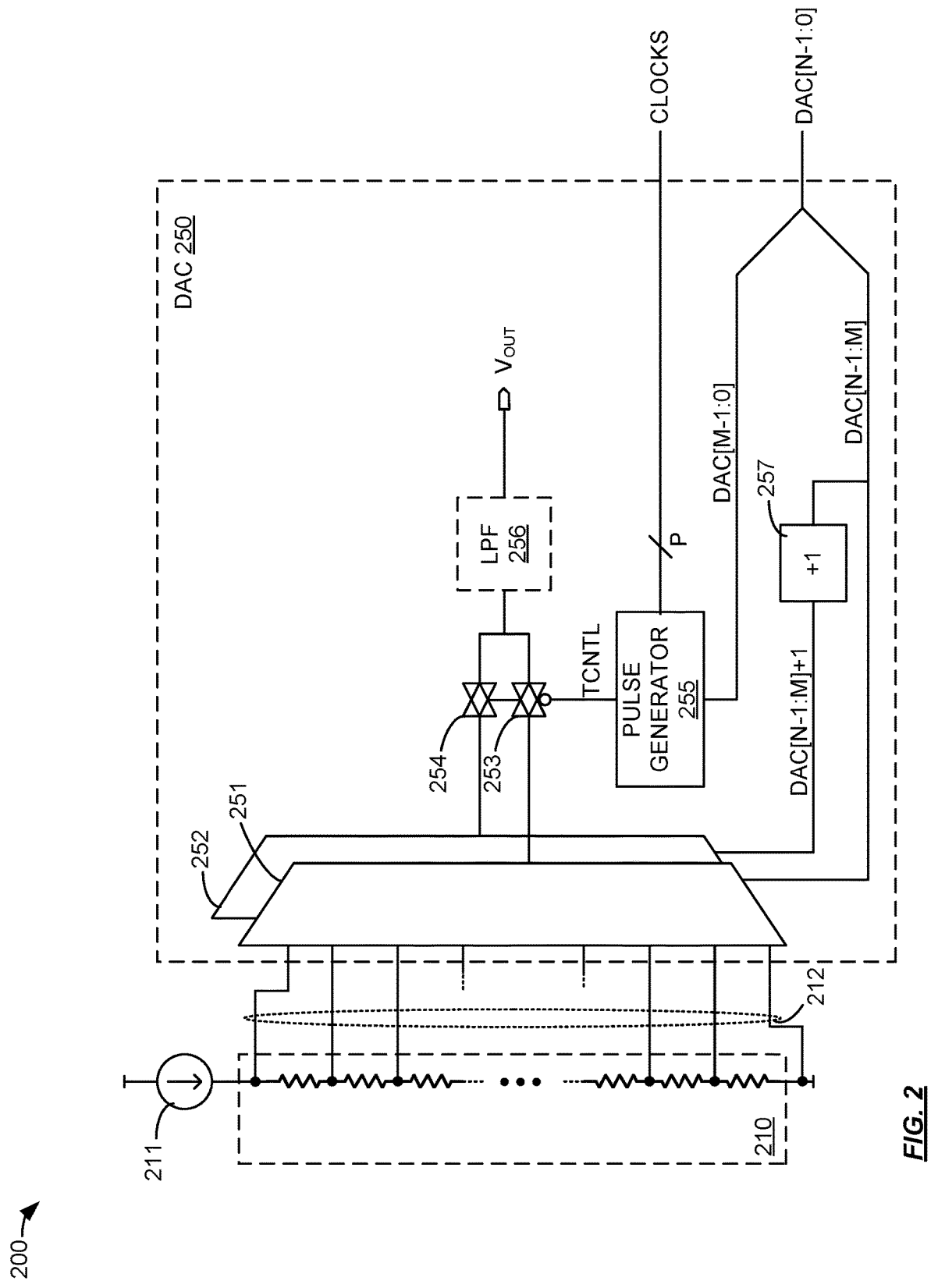
FIG. 2 is a block diagram illustrating a single DAC using a common voltage ladder.

FIG. 2 is a block diagram illustrating a single DAC using a common voltage ladder. In an embodiment, system 200 include common voltage ladder 210, reference current source 211, and DAC 250. In an embodiment, DAC 250 may be a one of PWM DACs 150 illustrated in FIG. 1. Thus, DAC 250 may share common voltage ladder 210 and reference current source 211 with other DACs 250. DAC 250 converts N-bit numbers (signals DAC[N−1:0]) to an analog output voltage $V_{OUT}$. DAC 250 comprises analog voltage selectors 251-252, transfer gates 253-254 (a.k.a. transmission gates), pulse generator 255, optional low pass filter 256, and plus one coding 257.

Reference current source 211 is operatively coupled to voltage ladder 210. Reference current source 211 is operatively coupled to voltage ladder 210 to cause a reference current to flow through the series connected resistors of voltage ladder 210. In an embodiment, reference current source 211 is a bandgap based current reference. The reference current flowing through the series connected resistors of voltage ladder 210 generates reference voltages 212 that are received by DAC 250. In particular, reference voltages 212 that are received from voltage ladder 210 are received by analog voltage selectors 251-252.

Analog voltage selector 251 selects a first one of the reference voltages 212 as determined by the value of the N−M most significant bits of DAC[N−1:0], where M is an integer greater than one and less than N−1. This is illustrated in FIG. 2 by the analog voltage selector 251 receiving the value of bits DAC[N−1:M]. Analog voltage selector 251 provides the first selected reference voltage to the input of transfer gate 253. Analog voltage selector 252 selects a second one of the reference voltages 212 as determined by the value of the N-M most significant bits of DAC[N−1:0] plus one. This is illustrated in FIG. 2 by plus one coding 257 receiving the value of bits DAC[N−1:M] and providing the value DAC[N−1:M]+1 to analog voltage selector 252. Analog voltage selector 252 provides the second selected reference voltage to the input of transfer gate 254.

It should be understood that in some embodiments plus one coding 257 may not be a literal addition of +1 to the value of DAC[N−1:M]. The function performed by plus one coding 257 that results in analog voltage selectors 251-252 selecting adjacent reference voltages may be incorporated into the design of analog voltage selector 251, analog voltage selector 252, both analog voltage selector 251 and analog voltage selector 252, a coding of DAC[N−1:M] and DAC[N−1:M]+1 (e.g., a single thermometer code wired in an offset manner between analog voltage selectors 251-252), and/or other circuitry (not shown in FIG. 2).

DAC 250 also receives P number of clock signals. In an embodiment, P=$2^M$. In another embodiment, P=$2^{M-1}$+1. Based on the value of the M least significant bits of DAC[N−1:0] (i.e., DAC[M−1:0]) pulse generator 255 processes one or more of the P clock signals and provides a signal (TCNTL) with selectable (based on DAC[M:0] value) duty cycles and/or pulse widths to the control inputs of transfer gates 253-254. In an embodiment, up to $2^M$ different TCNTL waveforms with different duty cycles may be output by pulse generator 255. Note that when transfer gate 253 is functioning to pass the reference voltage received from analog voltage selector 251 to low pass filter 256 (or directly to $V_{OUT}$), transfer gate 254 is functioning to block the reference voltage received from analog voltage selector 252. Similarly, when transfer gate 254 is functioning to pass the reference voltage received from analog voltage selector 252 to low pass filter 256 (or directly to $V_{OUT}$), transfer gate 253 is functioning to block the reference voltage received from analog voltage selector 251. This is illustrated in FIG. 2 by the "NOT" bubble on transfer gate 253 and the lack of a "NOT" bubble on transfer gate 254.

In an embodiment, transfer gates 253-254 alternately pass the selected reference voltages from analog voltage selectors 251-252, respectively to the input of low pass filter 256. The output of low pass filter 256 is the analog output voltage of DAC 250 $V_{OUT}$. In another embodiment, transfer gates 253-254 alternately pass the selected reference voltages from analog voltage selectors 251-252, respectively, directly as the analog output voltage of DAC 250 $V_{OUT}$.

Figure 3:
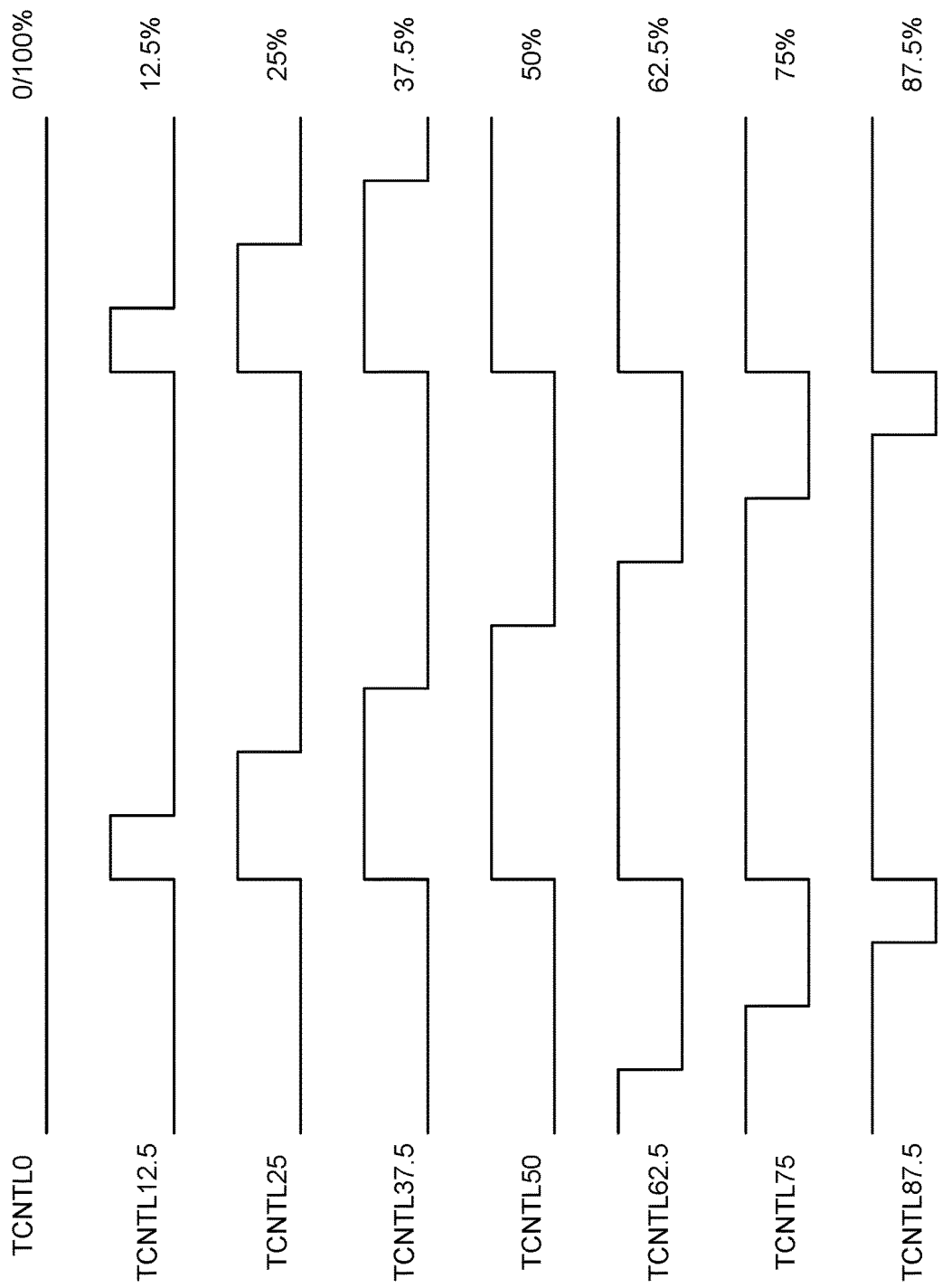
FIG. 3 is an illustration of example pulse-width modulation clock waveforms.

FIG. 3 is an illustration of example pulse-width modulation clock waveforms. The waveform illustrated in FIG. 3 may be used as, for example, the clocks input to DAC 250 (i.e., M=3 and P=8.) In FIG. 3, the "on" (high) duty cycles for TCNTL0, TCNTL12.5, TCNTL25, TCNTL37.5, TCNTL50, TCNTL62.5, TCNTL75, TCNTL87.5 are 0%, 12.5%, 25%, 37.5%, 50%, 62.5%, 75%, and 87.5%, respectively.

TCNTL0 has a 0% "on" (high) duty cycle. Thus, when pulse generator 255 is selecting TCNTL0, transfer gate 253 will always be passing the reference voltage received from analog voltage selector 251 to low pass filter 256 and transfer gate 254 will never be passing the reference voltage received from analog voltage selector 252 to low pass filter 256.

TCNTL12.5 has a 12.5% "on" (high) duty cycle. Thus, when pulse generator 255 is selecting TCNTL12.5, transfer gate 253 will be passing the reference voltage received from analog voltage selector 251 to low pass filter 256 87.5% of the time and transfer gate 254 will be passing the reference voltage received from analog voltage selector 252 to low pass filter 256 12.5% of the time. TCNTL25 has a 25% "on" (high) duty cycle. Thus, when pulse generator 255 is selecting TCNTL25, transfer gate 253 will be passing the reference voltage received from analog voltage selector 251 to low pass filter 256 75% of the time and transfer gate 254 will be passing the reference voltage received from analog voltage selector 252 to low pass filter 256 25% of the time. TCNTL37.5 has a 37.5% duty cycle resulting in analog voltage selector 251 providing its reference voltage 62.5% of the time and analog voltage selector 252 providing its reference voltage 37.5% of the time. Analogous results are obtained when ones of TCNTL50, TCNTL62.5, TCNTL75, TCNTL87.5 are selected and therefore, for the sake of brevity, will not be described herein.

It should be understood that the example clocks in FIG. 3 determine the percentages of time a respective reference voltage from an analog voltage selector 251-252 is applied to the input of low pass filter 256. Low pass filter 256 is configured to remove (or reduces) the ripple on low pass filters input caused by the alternating, by transfer gates 253-254, between the two reference voltages provided by analog voltage selectors 251-252. Because low pass filter 256 removes the ripple, and analog voltage selectors 251-252 are configured to select "adjacent" reference voltages from voltage ladder 210, and the duty cycles of PULSE[0]-PULSE[7] are evenly (linearly) distributed between 0% and 100% duty cycle, the average (or DC) output of low pass filter 256 is substantially given by the following equation:

$$V_{OUT}=V_{251} \times D_{253}+V_{252} \times D_{254}$$

Where $V_{251}$ is the reference voltage selected by analog voltage selector 251, $V_{252}$ is the reference voltage selected by analog voltage selector 252, $D_{253}$ is the duty cycle of transfer gate 253, and $D_{254}$ is the duty cycle of transfer gate 254. In an embodiment, the sum of the duty cycle of transfer gate 253 and the duty cycle of transfer gate 254 equals 100%. In other words, $D_{253}+D_{254}=100\%$ or equivalently:

$$V_{OUT}=V_{251} \times (1-D_{254})+V_{252} \times D_{254}$$

Take, for example, a first reference voltage of 1.0 V being selected by analog voltage selector 251; a second (adjacent) reference voltage of 2.0 V being selected by analog voltage selector 252; and a DAC[M−1:0] value of six (6) that causes pulse generator 255 to select PULSE[6] (which turns on transfer gate 253 25% of the time and transfer gate 254 75% of the time.) This results in:

$$V_{OUT}=1.0 \times 0.25+2.0 \times 0.75=1.75V$$

When DAC[M−1:0] has a value of five (5), pulse generator 255 selects PULSE[5] which turns on transfer gate 253 37.5% of the time and transfer gate 254 62.5% of the time. This results in:

$$V_{OUT}=1.0 \times 0.375+2.0 \times 0.625=1.625V$$

Thus, it should be understood that the waveforms illustrated in FIG. 3 have been selected to provide an additional 3-bits of linear resolution (8 levels) in-between the reference voltages generated by shared (common) voltage ladder 210.

Figure 4:
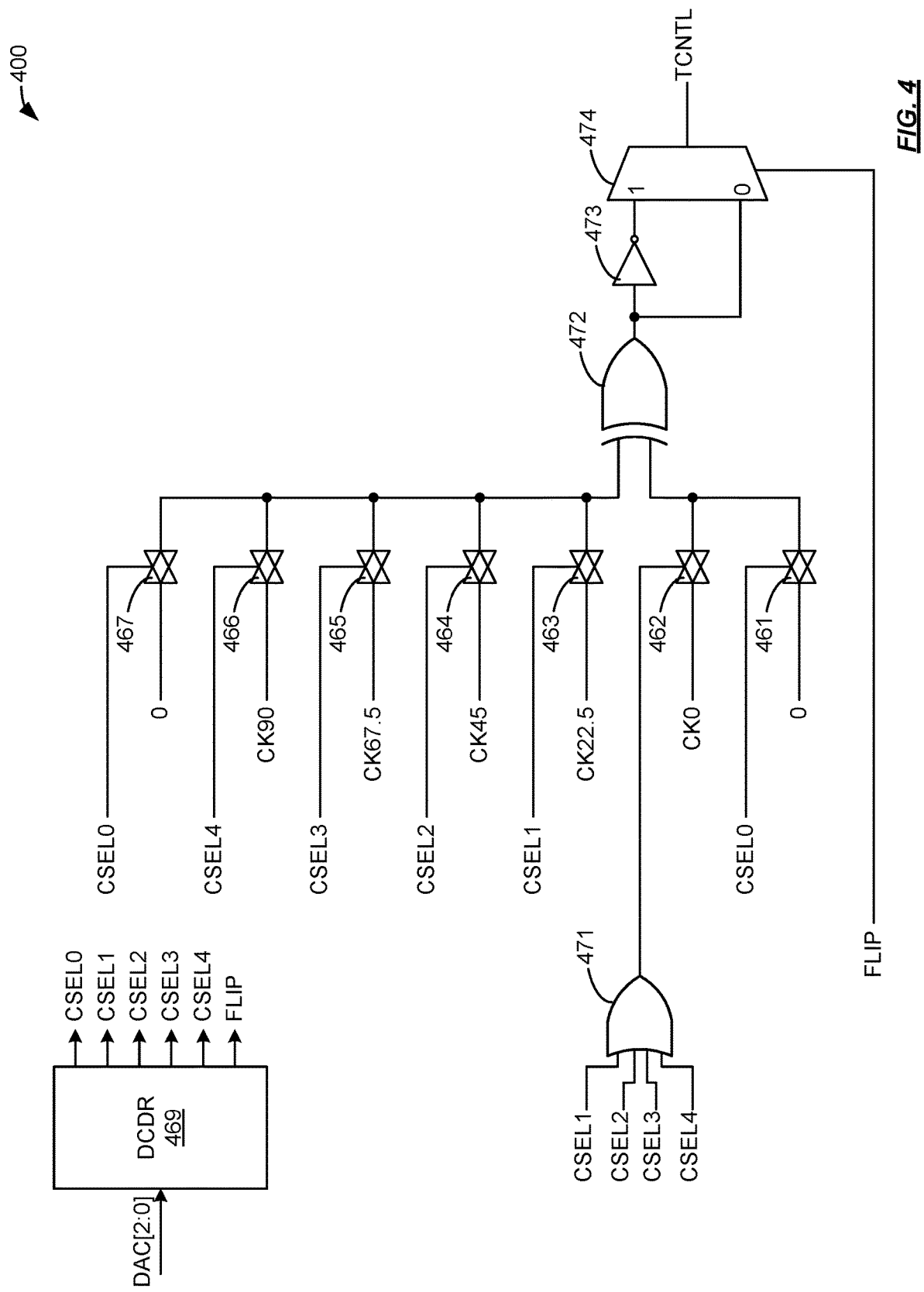
FIG. 4 is a diagram illustrating pulse-width modulation waveform generating circuitry.

FIG. 4 is a diagram illustrating pulse-width modulation waveform generating circuitry. Pulse generator 400 may be an example of pulse generator 255. Thus, in this example, pulse generator 400 receives a plurality of clock signals CK0, CK22.5, CK45, CK67.5, CK90 (e.g., P=5) and produces an output signal (TCNTL) to toggle transfer gates 253-254. In an embodiment, clock signals CK22.5, CK45, CK67.5, CK90 cycle at the same frequency as CK0 but are delayed relative CK0. Thus, it should be understood that CK22.5 cycles at the same frequency as CK0 but is delayed relative to CK0 by 22.5° of phase, CK45 cycles at the same frequency as CK0 but is delayed relative to CK0 by 45° of phase, and so on. (See, e.g., FIG. 5.)

In FIG. 4, pulse generator 400 includes transfer gates 461-467, decoder 469, 4-input OR gate 471, exclusive-OR (XOR) gate 472, inverter 473, and 2:1 multiplexor (MUX) 474. Decoder 469 receives the least significant bits (i.e., M=3 or DAC[2:0]) of the digital number to be (or being) converted to an analog voltage. Based on the value of DAC[2:0], decoder 469 outputs a single logic "1" on CSEL0-CSEL4 and a value for the FLIP signal. An example truth table for decoder 469 is detailed in Table 1.

TABLE 1

| DAC[2:0] | TCNTL = 1 percentage | CSEL0 | CSEL1 | CSEL2 | CSEL3 | CSEL4 | FLIP |
|---|---|---|---|---|---|---|---|
| 000 | 0% | 1 | 0 | 0 | 0 | 0 | 0 |
| 001 | 12.5% | 0 | 1 | 0 | 0 | 0 | 0 |
| 010 | 25% | 0 | 0 | 1 | 0 | 0 | 0 |
| 011 | 37.5% | 0 | 0 | 0 | 1 | 0 | 0 |
| 100 | 50% | 0 | 0 | 0 | 0 | 1 | 1 or 0 |
| 101 | 62.5% | 0 | 0 | 0 | 1 | 0 | 1 |
| 110 | 75% | 0 | 0 | 1 | 0 | 0 | 1 |
| 111 | 87.5% | 0 | 1 | 0 | 0 | 0 | 1 |

CSEL0 is provided to the control terminal of transfer gate 461 and transfer gate 467. CSEL1 is provided to a first input of OR gate 471 and the control terminal of transfer gate 463. CSEL2 is provided to a second input of OR gate 471 and the control terminal of transfer gate 464. CSEL3 is provided to a third input of OR gate 471 and the control terminal of transfer gate 465. CSEL4 is provided to a first input of OR gate 471 and the control terminal of transfer gate 466. The output of OR gate 471 is provided to the control terminal of transfer gate 462.

A constant logical "0" is provided to the input of transfer gate 461. The output of transfer gate 461 is provided to a first input of XOR 472. The clock signal CK0 is provided to the input of transfer gate 462. The output of transfer gate 462 is provided to the first input of XOR 472.

The clock signal CK22.5 is provided to the input of transfer gate 463. The output of transfer gate 463 is provided to a second input of XOR 472. The clock signal CK45 is provided to the input of transfer gate 464. The output of transfer gate 464 is provided to the second input of XOR 472. The clock signal CK45 is provided to the input of transfer gate 464. The output of transfer gate 464 is provided to the second input of XOR 472. The clock signal CK67.5 is provided to the input of transfer gate 465. The output of transfer gate 465 is provided to the second input of XOR 472. The clock signal CK90 is provided to the input of transfer gate 466. The output of transfer gate 466 is provided to the second input of XOR 472. A constant logical "1" is provided to the input of transfer gate 467. The output of transfer gate 467 is provided to the second input of XOR 472.

The output of XOR 472 is provided to the input of inverter 473 and a first input of MUX 474. The first input of MUX 474 is selected to be output by MUX 474 when the FLIP signal is a "0". The output of inverter 473 in provided to a second input of MUX 474. The second input of MUX 474 is selected to be output by MUX 474 when the FLIP signal is a "1". Thus, it should be understood that when the FLIP signal is a "0", the output of XOR 472 is used as the TCNTL signal. When the FLIP signal is a "1", the inversion of the output of XOR 472 is used as the TCNTL signal.

In an embodiment, the CK0 signal is a clock signal with substantially a 50% duty cycle. The CK22.5 signal is a clock signal with substantially a 50% duty cycle that is delayed by 22.5° of phase from CK0. The CK67.5 signal is a clock signal with substantially a 50% duty cycle that is delayed by 67.5° of phase from CK0. The CK90 signal is a clock signal with substantially a 50% duty cycle that is delayed by 90° of phase from CK0.

FIG. 5 is an illustration of input clock waveforms for generating pulse-width modulation waveforms. In FIG. 5, a clock signal CK8X is illustrated toggling with substantially a 50% duty cycle. The edges of CK8X are used to generate the clocks CK0, CK22.5, CK45, CK67.5, and CK90. The clocks CK0, CK22.5, CK45, CK67.5, and CK90 toggle at ⅛ the frequency of CK8X. Thus, each edge of CK8X may be used to initiate a state change of a one of CK0, CK22.5, CK45, CK67.5, and CK90 to provide the phase differences described herein.

For example, a first rising edge of CK8X may be used to cause a rising edge of CK0. This is illustrated in FIG. 5 by arrow 501a from a rising edge of CK8X to the rising edge of CK0. The rising edge of CK8X four cycles of CK8X later may be used to cause a falling edge of CK0. This is illustrated in FIG. 5 by arrow 501b from the rising edge of CK8X four cycles after the first rising edge to the falling edge of CK0. To generate CK22.5, which is delay 22.5° of phase from CK0, the falling edge of CK8X immediately after the first rising edge of CK8X may be used to cause a rising edge of CK22.5. This is illustrated in FIG. 5 by arrow 502a from a falling edge of CK8X to the rising edge of CK22.5. The falling edge of CK8X four cycles of CK8X later may be used to cause a falling edge of CK22.5. This is illustrated in FIG. 5 by arrow 502b from the falling edge of CK8X four cycles after the first edge to the falling edge of CK0. A similar pattern of using selected rising and falling edges of CK8X to cause state changes on CK45, CK67.5, and CK90 may be used to generate CK45, CK67.5, and CK90.

XOR 472 generates TCNTL from CK0 and a selected one of CK22.5, CK45, CK67.5, and CK90 when CSEL0 is not equal to "1". For example, to generate a TCNTL signal with a 62.5% "on" duty cycle, decoder 469 may assert CSEL3=1 to cause CK0 to be provided to the first input of XOR 472 and CK67.5 to be provided to the second input of XOR 472. The phase difference between CK0 and CK67.5 produces a signal at the output of XOR 472 with a duty cycle of 37.5%. Decoder 469 also asserts FLIP=1 to invert the output of XOR 472 using inverter 473 and the second input (FLIP=1) to MUX 474 thereby causing MUX 474 to output a TCNTL signal with a duty cycle of 62.5%. This is illustrated in FIG. 5 by the dashed line arrows from CK0 edges and CK67.5 edges to edges of TCNTL62.5.

FIG. 6 is a flowchart illustrating a method of generating matched digital-to-analog output voltages. One or more steps illustrated in FIG. 6 may be performed by, for example, system 100, system 200, pulse generator 400, and/or their components. A first reference voltage and a second reference voltage are selected from a plurality of reference voltages generated by a resistive ladder that is shared by a plurality of pulse-width modulation digital to analog converters (602). For example, analog voltage selectors 251-252 may select a first reference voltage and a second reference voltage, respectively, that are generated by voltage ladder 210.

A clock signal cycling at a clock signal cycle time is received (604). For example, transfer gates 253-254 may receive a toggling TCNTL signal that cycles at $\frac{1}{8}^{th}$ the CK8X frequency. The first reference voltage is selected to be provided to a pulse-width modulation output node for a first portion of the clock signal cycle time (606). For example, transfer gate 253 may, when TCNTL is "0", provide the first selected reference voltage received from analog voltage selector 251 to the input to low pass filter 256 or $V_{OUT}$. The second reference voltage is selected to be provided to the pulse-width modulation output node for a second portion of the clock signal cycle time (608). For example, transfer gate 253 may, when TCNTL is "1", provide the second selected reference voltage received from analog voltage selector 252 to the input to low pass filter 256 or $V_{OUT}$.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 200, pulse generator 400, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
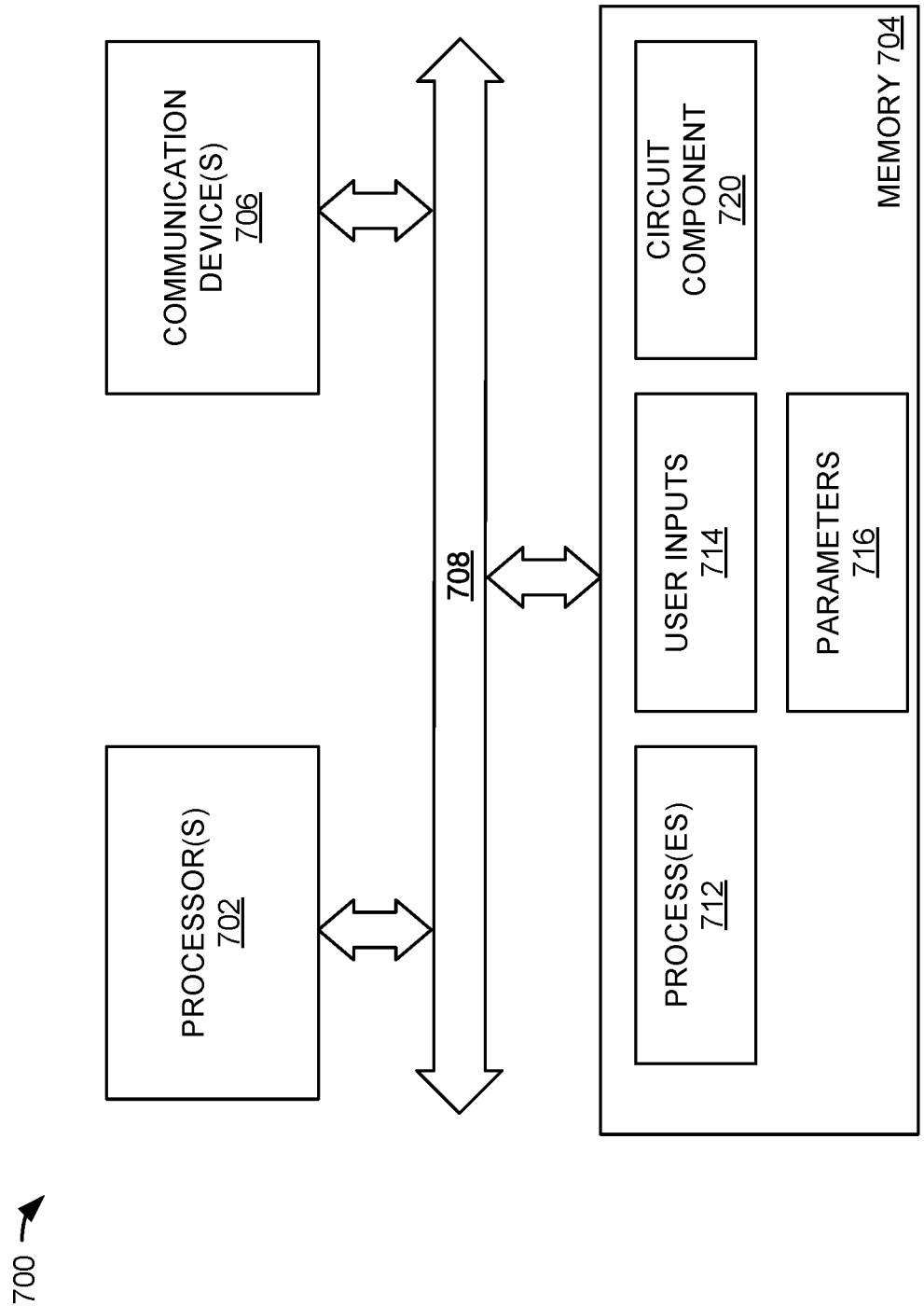
FIG. 7 is a block diagram of a processing system.

FIG. 7 is a block diagram illustrating one embodiment of a processing system 700 for including, processing, or generating, a representation of a circuit component 720. Processing system 700 includes one or more processors 702, a memory 704, and one or more communications devices 706. Processors 702, memory 704, and communications devices 706 communicate using any suitable type, number, and/or configuration of wired and/or wireless connections 708.

Processors 702 execute instructions of one or more processes 712 stored in a memory 704 to process and/or generate circuit component 720 responsive to user inputs 714 and parameters 716. Processes 712 may be any suitable electronic design automation (EDA) tool or portion thereof used to design, simulate, analyze, and/or verify electronic circuitry and/or generate photomasks for electronic circuitry. Representation 720 includes data that describes all or portions of system 100, system 200, pulse generator 400, and their components, as shown in the Figures.

Representation 720 may include one or more of behavioral, register transfer, logic component, transistor, and layout geometry-level descriptions. Moreover, representation 720 may be stored on storage media or communicated by carrier waves.

Data formats in which representation 720 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 714 may comprise input parameters from a keyboard, mouse, voice recognition interface, microphone and speakers, graphical display, touch screen, or other type of user interface device. This user interface may be distributed among multiple interface devices. Parameters 716 may include specifications and/or characteristics that are input to help define representation 720. For example, parameters 716 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 704 includes any suitable type, number, and/or configuration of non-transitory computer-readable storage media that stores processes 712, user inputs 714, parameters 716, and circuit component 720.

Communications devices 706 include any suitable type, number, and/or configuration of wired and/or wireless devices that transmit information from processing system 700 to another processing or storage system (not shown) and/or receive information from another processing or storage system (not shown). For example, communications devices 706 may transmit circuit component 720 to another system. Communications devices 706 may receive processes 712, user inputs 714, parameters 716, and/or circuit component 720 and cause processes 712, user inputs 714, parameters 716, and/or circuit component 720 to be stored in memory 704.

Implementations discussed herein include, but are not limited to, the following examples:

Example 1: An integrated circuit, comprising: a resistive ladder to generate a plurality of reference voltages; and, a first pulse width modulation stage coupled to the resistive ladder to alternately select between a first selected one of the plurality of reference voltages for a first portion of a clock cycle of a clock signal and a second one of the plurality of reference voltages for a second portion of the clock cycle to produce a first output signal, the second portion of the clock cycle to be a remaining portion of the clock cycle after the first portion of the clock cycle is removed from the clock cycle.

Example 2: The integrated circuit of example 1, further comprising: a plurality of phase shifted clock signals to have the same clock cycle as the clock signal and to have different phase shifts relative to the clock signal and other of the plurality of phase shifted clock signals.

Example 3: The integrated circuit of example 2, wherein the first portion of the clock cycle is based on a difference in states between the clock signal and a selected one of the plurality of phase shifted clock signals.

Example 4: The integrated circuit of example 1, further comprising: a second pulse width modulation stage coupled to the resistive ladder to alternately select between a second selected one of the plurality of reference voltages for a third portion of the clock cycle of the clock signal and a fourth one of the plurality of reference voltages for a fourth portion of the clock cycle to produce a second output signal, the fourth portion of the clock cycle to be a second remaining portion of the clock cycle after the third portion of the clock cycle is removed from the clock cycle.

Example 5: The integrated circuit of example 4, wherein a voltage difference between the first output signal and the second output signal form a differential reference voltage.

Example 6: The integrated circuit of example 1, wherein the resistive ladder is to receive a reference current.

Example 7: The integrated circuit of example 6, wherein the reference current is generated using a bandgap based current reference that is on the integrated circuit.

Example 8: An integrated circuit, comprising: a plurality of pulse-width modulation (PWM) digital to analog converters (DACs) sharing a common voltage reference ladder to produce a plurality of reference voltages; and, the PWM DACs comprising: selection circuitry to provide a first selected reference voltage and a second selected reference voltage to PWM selection circuitry, the PWM selection circuitry to select the first selected reference voltage to as a PWM output voltage with a first duty cycle and to select the second selected reference voltage to as the PWM output voltage with a second duty cycle.

Example 9: The integrated circuit of example 8, wherein the first duty cycle and the second duty cycle are non-overlapping.

Example 10: The integrated circuit of example 9, wherein the second duty cycle is an inversion of the first duty cycle.

Example 11: The integrated circuit of example 8, wherein the first selected reference voltage and the second selected reference voltage are selected using a first number of most-significant bits.

Example 12: The integrated circuit of example 11, wherein the first selected reference voltage and the second selected reference voltage are selected using consecutive codes of the first number of most-significant bits.

Example 13: The integrated circuit of example 11, wherein the first duty cycle and the second duty cycle are selected using a second number of least-significant bits.

Example 14: The integrated circuit of example 11, wherein a second number of least-significant bits selects a phase difference between two clock signals to be provided as the first duty cycle.

Example 15: A method, comprising: selecting a first reference voltage and a second reference voltage from a plurality of reference voltages generated by a resistive ladder that is shared by a plurality of pulse-width modulation digital to analog converters; receiving a first clock signal cycling at a clock signal cycle time; selecting the first reference voltage to be provided to a pulse-width modulation output node for a first portion of a clock signal cycle time; and, selecting the second reference voltage to be provided to the pulse-width modulation output node for a second portion of the clock signal cycle time.

Example 16: The method of example 15, wherein the second portion of the clock signal cycle time is a remaining portion of the clock signal cycle time after the first portion of the clock signal cycle time is removed from the first clock signal.

Example 17: The method of example 16, further comprising: receiving a plurality of clock signals cycling at the clock signal cycle time that each have a different phase relationship to the first clock signal.

Example 18: The method of example 17, wherein the first portion of the clock signal cycle time is based on the first clock signal and a second clock signal.

Example 19: The method of example 17, wherein the first portion of the clock signal cycle time is based on a difference between the first clock signal and a second clock signal.

Example 20: The method of example 17, wherein the first portion of the clock signal cycle time is based on a digital comparison between the first clock signal and a second clock signal.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
   a resistive ladder to generate a plurality of reference voltages; and,
   a first pulse width modulation stage coupled to the resistive ladder to alternately select between a first selected one of the plurality of reference voltages for a first portion of a clock cycle of a clock signal and a second one of the plurality of reference voltages for a second portion of the clock cycle to produce a first output signal, the second portion of the clock cycle to be a remaining portion of the clock cycle after the first portion of the clock cycle is removed from the clock cycle.

2. The integrated circuit of claim 1, further comprising:
   a plurality of phase shifted clock signals to have the same clock cycle as the clock signal and to have different phase shifts relative to the clock signal and other of the plurality of phase shifted clock signals.

3. The integrated circuit of claim 2, wherein the first portion of the clock cycle is based on a difference in states between the clock signal and a selected one of the plurality of phase shifted clock signals.

4. The integrated circuit of claim 1, further comprising:
   a second pulse width modulation stage coupled to the resistive ladder to alternately select between a second selected one of the plurality of reference voltages for a third portion of the clock cycle of the clock signal and a fourth one of the plurality of reference voltages for a fourth portion of the clock cycle to produce a second output signal, the fourth portion of the clock cycle to be a second remaining portion of the clock cycle after the third portion of the clock cycle is removed from the clock cycle.

5. The integrated circuit of claim 4, wherein a voltage difference between the first output signal and the second output signal form a differential reference voltage.

6. The integrated circuit of claim 1, wherein the resistive ladder is to receive a reference current.

7. The integrated circuit of claim 6, wherein the reference current is generated using a bandgap based current reference that is on the integrated circuit.

8. An integrated circuit, comprising:
a plurality of pulse-width modulation (PWM) digital to analog converters (DACs) sharing a common voltage reference ladder to produce a plurality of reference voltages; and,
the PWM DACs comprising:
selection circuitry to provide a first selected reference voltage and a second selected reference voltage to PWM selection circuitry, the PWM selection circuitry to select the first selected reference voltage to as a PWM output voltage with a first duty cycle and to select the second selected reference voltage to as the PWM output voltage with a second duty cycle.

9. The integrated circuit of claim 8, wherein the first duty cycle and the second duty cycle are non-overlapping.

10. The integrated circuit of claim 9, wherein the second duty cycle is an inversion of the first duty cycle.

11. The integrated circuit of claim 8, wherein the first selected reference voltage and the second selected reference voltage are selected using a first number of most-significant bits.

12. The integrated circuit of claim 11, wherein the first selected reference voltage and the second selected reference voltage are selected using consecutive codes of the first number of most-significant bits.

13. The integrated circuit of claim 11, wherein the first duty cycle and the second duty cycle are selected using a second number of least-significant bits.

14. The integrated circuit of claim 11, wherein a second number of least-significant bits selects a phase difference between two clock signals to be provided as the first duty cycle.

15. A method, comprising:
selecting a first reference voltage and a second reference voltage from a plurality of reference voltages generated by a resistive ladder that is shared by a plurality of pulse-width modulation digital to analog converters;
receiving a first clock signal cycling at a clock signal cycle time;
selecting the first reference voltage to be provided to a pulse-width modulation output node for a first portion of a clock signal cycle time; and,
selecting the second reference voltage to be provided to the pulse-width modulation output node for a second portion of the clock signal cycle time.

16. The method of claim 15, wherein the second portion of the clock signal cycle time is a remaining portion of the clock signal cycle time after the first portion of the clock signal cycle time is removed from the first clock signal.

17. The method of claim 16, further comprising:
receiving a plurality of clock signals cycling at the clock signal cycle time that each have a different phase relationship to the first clock signal.

18. The method of claim 17, wherein the first portion of the clock signal cycle time is based on the first clock signal and a second clock signal.

19. The method of claim 17, wherein the first portion of the clock signal cycle time is based on a difference between the first clock signal and a second clock signal.

20. The method of claim 17, wherein the first portion of the clock signal cycle time is based on a digital comparison between the first clock signal and a second clock signal.

* * * * *